United States Patent
Nummy et al.

(10) Patent No.: US 9,412,640 B2
(45) Date of Patent: Aug. 9, 2016

(54) SEMICONDUCTOR DEVICE INCLUDING SUBSTRATE CONTACT AND RELATED METHOD

(71) Applicant: GLOBALFOUNDRIES INC., Grand Cayman (KY)

(72) Inventors: Karen A. Nummy, Newburgh, NY (US); Ravi M. Todi, Poughkeepsie, NY (US)

(73) Assignee: GlobalFoundries, Inc., Grand Cayman (KY)

(*) Notice: Subject to any disclaimer, the term of this patent is extended or adjusted under 35 U.S.C. 154(b) by 255 days.

(21) Appl. No.: 13/749,830

(22) Filed: Jan. 25, 2013

(65) Prior Publication Data

US 2014/0213053 A1    Jul. 31, 2014

(51) Int. Cl.
H01L 21/44 (2006.01)
H01L 21/74 (2006.01)
H01L 29/94 (2006.01)

(52) U.S. Cl.
CPC ............ *H01L 21/743* (2013.01); *H01L 29/945* (2013.01)

(58) Field of Classification Search
None
See application file for complete search history.

(56) References Cited

U.S. PATENT DOCUMENTS

| | | | |
|---|---|---|---|
| 6,376,924 B1 * | 4/2002 | Tomita et al. | 257/797 |
| 6,566,205 B1 | 5/2003 | Yu et al. | |
| 6,653,678 B2 * | 11/2003 | Chidambarrao et al. | 257/301 |
| 6,773,999 B2 | 8/2004 | Yoneda | |
| 6,989,561 B2 | 1/2006 | Lin et al. | |
| 7,247,914 B2 | 7/2007 | Uchiyama | |
| 7,256,439 B2 | 8/2007 | Cheng et al. | |
| 7,306,985 B2 | 12/2007 | Sasaki et al. | |
| 7,371,647 B2 | 5/2008 | Beaman et al. | |
| 7,435,640 B2 | 10/2008 | Wang et al. | |
| 7,514,376 B2 | 4/2009 | Hori | |
| 7,671,394 B2 | 3/2010 | Booth, Jr. et al. | |
| 7,923,815 B2 | 4/2011 | Wang et al. | |
| 7,943,500 B2 | 5/2011 | Yamaguchi et al. | |
| 8,026,133 B2 | 9/2011 | Ozawa et al. | |
| 8,053,823 B2 | 11/2011 | Cheng et al. | |
| 2005/0124121 A1 | 6/2005 | Rotondaro et al. | |
| 2006/0157779 A1 * | 7/2006 | Kachi et al. | 257/330 |
| 2009/0020880 A1 * | 1/2009 | Paik | 257/773 |
| 2009/0236691 A1 * | 9/2009 | Dyer et al. | 257/532 |

* cited by examiner

*Primary Examiner* — Calvin Choi

(74) *Attorney, Agent, or Firm* — Yuanmin Cai; Hoffman Warnick LLC

(57) ABSTRACT

A method of forming a contact on a semiconductor device is disclosed. The method includes: forming a mask on the semiconductor device, the mask exposing at least one contact node disposed within a trench in a substrate of the semiconductor device; performing a first substrate contact etch on the semiconductor device, the first substrate contact etch recessing the exposed contact node within the trench;

removing a set of node films disposed above the exposed contact node and on the sides of the trench; and forming a contact region within the trench above the exposed contact node, the contact region contacting the substrate.

18 Claims, 8 Drawing Sheets

US 9,412,640 B2

SEMICONDUCTOR DEVICE INCLUDING SUBSTRATE CONTACT AND RELATED METHOD

TECHNICAL FIELD

Embodiments of this disclosure relate generally to semiconductor devices and, more particularly, to a semiconductor device including a substrate contact formed from portions of a deep trench (e.g., a trench capacitor), a related method and design structure.

BACKGROUND

In semiconductor devices, contacts (e.g., substrate contacts, low resistance contacts, contacts to an N+ buried plate, etc.) are frequently included in device design to perform various functions and features of/in the finished device. Formation of these contacts frequently requires inclusion of a number of steps in the semiconductor manufacturing/fabrication process. These steps include etching portions of the semiconductor device to go through formed layers and expose the substrate and/or using a device contact level silicide and/or a (MOL) metal to connect to the N+ buried plate. These processes require a hole to be formed/etched through layers of the semiconductor device and the contact to be positioned within the hole formed in the existing structure. However, in some semiconductor devices (e.g., newer designs, new technologies, smaller design and/or build devices, etc.), etching these holes/contacts and creating a low resistance contact may be problematic due to process integration adjustments and requirements. Further, this etching and formation may create structures on the wafers which are problematic for an integrated process flow (e.g., a non-planar contact structure, deep hole on the wafer, etc.).

BRIEF SUMMARY

A first aspect of the disclosure provides a method including: forming a mask on the semiconductor device, the mask exposing at least one contact region including a trench disposed in a substrate of the semiconductor device; performing a first substrate contact etch on the semiconductor device, the first substrate contact etch recessing the exposed contact region within the trench; removing a set of node films disposed above the exposed contact region and on the sides of the trench; and forming a contact within the trench to the substrate.

A second aspect of the disclosure provides a method of forming a contact on a semiconductor device, the method comprising: forming a mask on the semiconductor device, the semiconductor device including a set of contact nodes and the mask exposing at least one contact node disposed within a trench in a substrate of the semiconductor device; performing a first substrate contact etch on the semiconductor device, the first substrate contact etch recessing the at least one exposed contact node within the trench; removing the mask from the semiconductor device; performing a second substrate contact etch on the semiconductor device, the second substrate contact etch recessing the set of contact nodes within the semiconductor device; removing a set of node films disposed above the set of contact nodes and on the sides of the trench; and forming a contact region within the trench above the contact nodes.

A third aspect of the disclosure provides a method of forming a semiconductor device, the method including: method of forming a contact on a semiconductor device, the method comprising: masking regions of the semiconductor device other than a set of substrate contacts, the set of substrate contacts including a set of contact nodes disposed within a trench in a substrate of the semiconductor device; etching about the set of substrate contacts on the semiconductor device; removing a portion of the set of contact nodes from the trench; and forming a contact region within the trench above the set of contact nodes, the contact region substantially connected to the set of contact nodes and the substrate.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

It is noted that the demonstrative illustrations of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-8, like numbering may represent like elements. Redundant explanation of these elements has been omitted for clarity. Finally, it is understood that the components of FIGS. 1-8 and their accompanying descriptions may be applied to any embodiment described herein.

DETAILED DESCRIPTION

Figure 1:
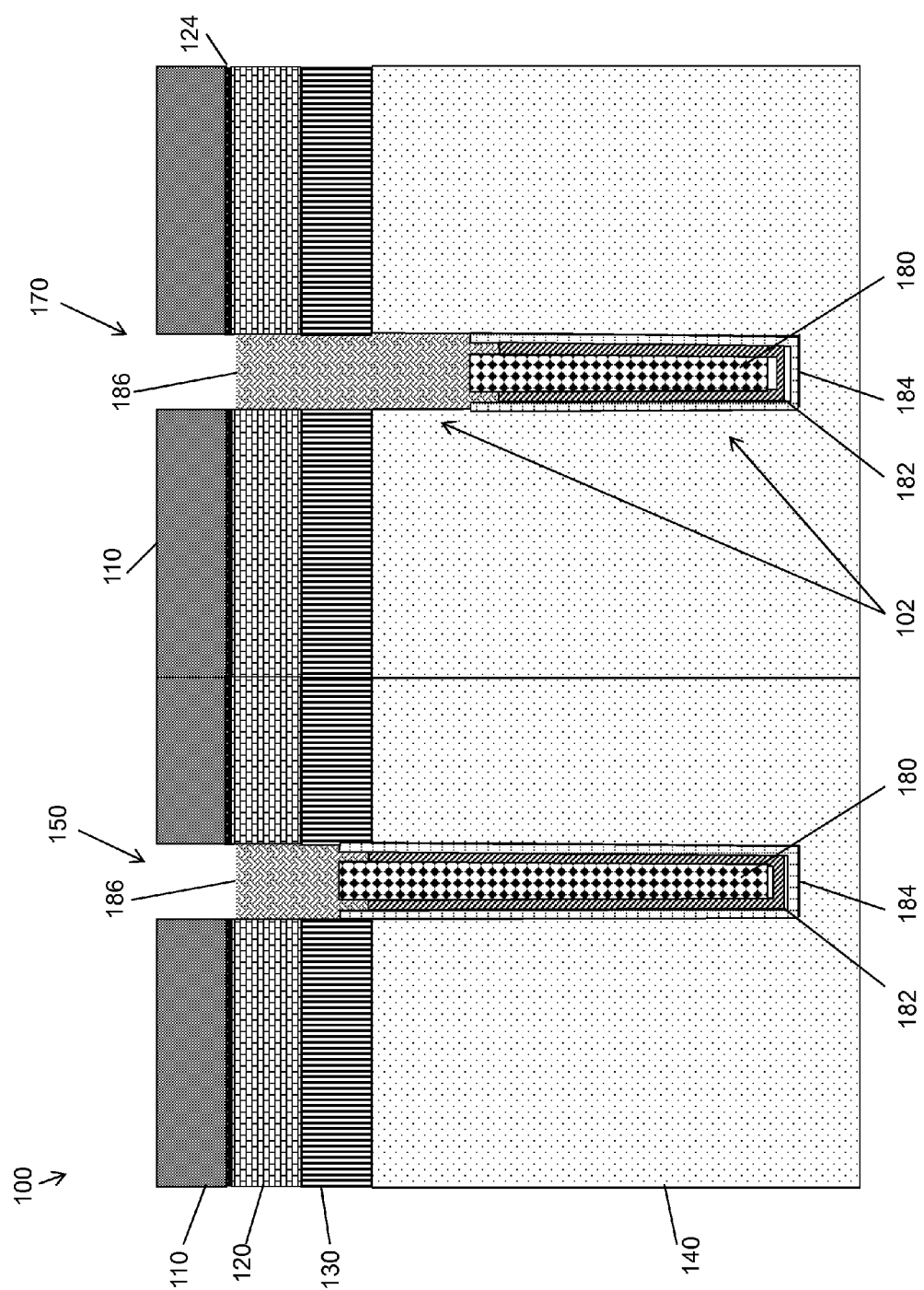
FIG. 1 is a demonstrative illustration of a portion of a semiconductor device according to an embodiment of the invention.

FIG. 1 is a demonstrative illustration of a cross sectional view of a portion of a semiconductor device 100 according to embodiments of the invention. Semiconductor device 100 may include a substrate 140 with a buried oxide (BOX) region 130, a silicon-on-insulator (SOI) region 120, and a nitride region 110 formed thereon. In an embodiment, a thin oxide layer 124 may be disposed between SOI region 120 and nitride region 110. Semiconductor device 100 may include a first substrate contact 150 and a second substrate contact 170. First substrate contact 150 and/or second substrate contact 170 may be formed in accordance with methods described herein in deep trenches on semiconductor device 100. In one embodiment, second substrate contact 170 may include a node 180 (e.g., a polysilicon node) disposed entirely within substrate 140 and between a first node film 182 and a second node film 184. In one embodiment, first node film 182 and/or second node film 184 may include an oxynitride, hafnium oxide ($HfO_2$), and/or titanium nitride (TiN). Node 180 may be disposed below BOX region 130 within a trench 102. A portion of second substrate contact 170 may include a contact region (e.g., doped polysilicon) 186 disposed upon/proximate node 180 and within substrate 140, BOX region 130 and/or SOI region 120. It is understood that the use of BOX region 130, SOI region 120, and nitride region 110 in this embodiment is merely exemplary, and that any form of region and/or material (e.g., substrate, isolation region, oxygen, etc.) may be formed on substrate 140.

FIGS. 2-7 are demonstrative illustrations of a device undergoing processes in a method according to embodiments. Although FIGS. 2-7 show the method of forming portions of semiconductor device 100 in FIG. 1, it is understood that a similar method may be employed to form any other like semiconductor device and that any other processes and features may be included as a part of the build process.

Returning to FIG. 2, a demonstrative illustration of a cross-sectional view of semiconductor device 100 undergoing a process according to embodiments is shown. In this embodiment, semiconductor device 100 has BOX region 130, SOI region 120, and nitride region 110 formed on substrate 140. In one embodiment, at least one of BOX region 130, SOI region 120, and nitride region 110 may be deposited on substrate 140. As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Figure 2:
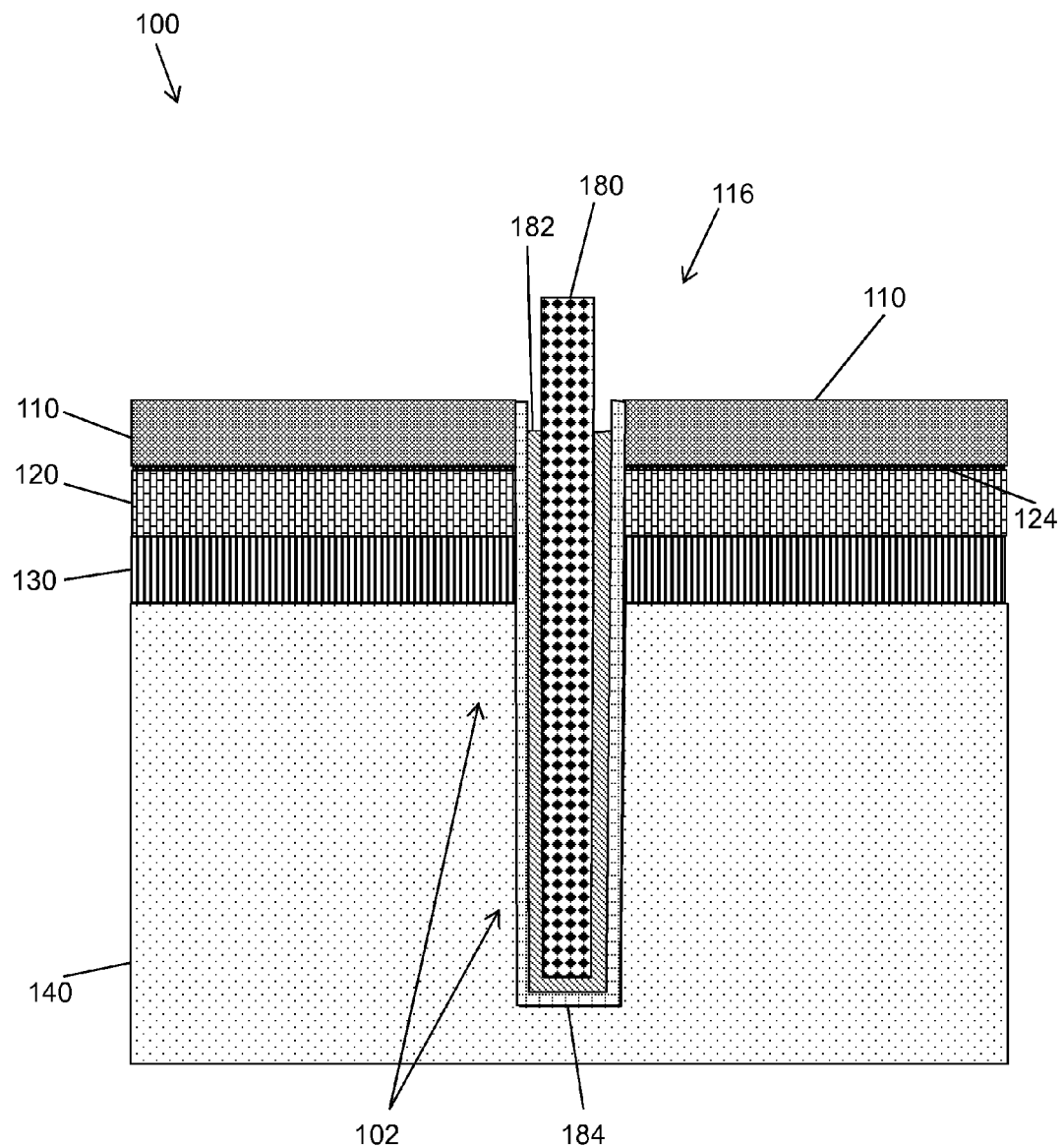
FIGS. 2-7 are demonstrative illustrations of a method of forming a semiconductor device according to embodiments of the invention.

As can be seen in FIG. 2, substrate 100 may include a trench 102 which includes a node 180 which extends above substrate 140. A first node film 182 and a second node film 184 may be disposed on the sides of trench 102. In one embodiment, first node film 182 and second node film 184 may insulate node 180. Node 180 may include polysilicon and may extend throughout trench 102, through BOX region 130, SOI region 120, and nitride region 110. First node film 182, second node film 184, and node 180 may be formed in accordance with known methods.

Figure 3:
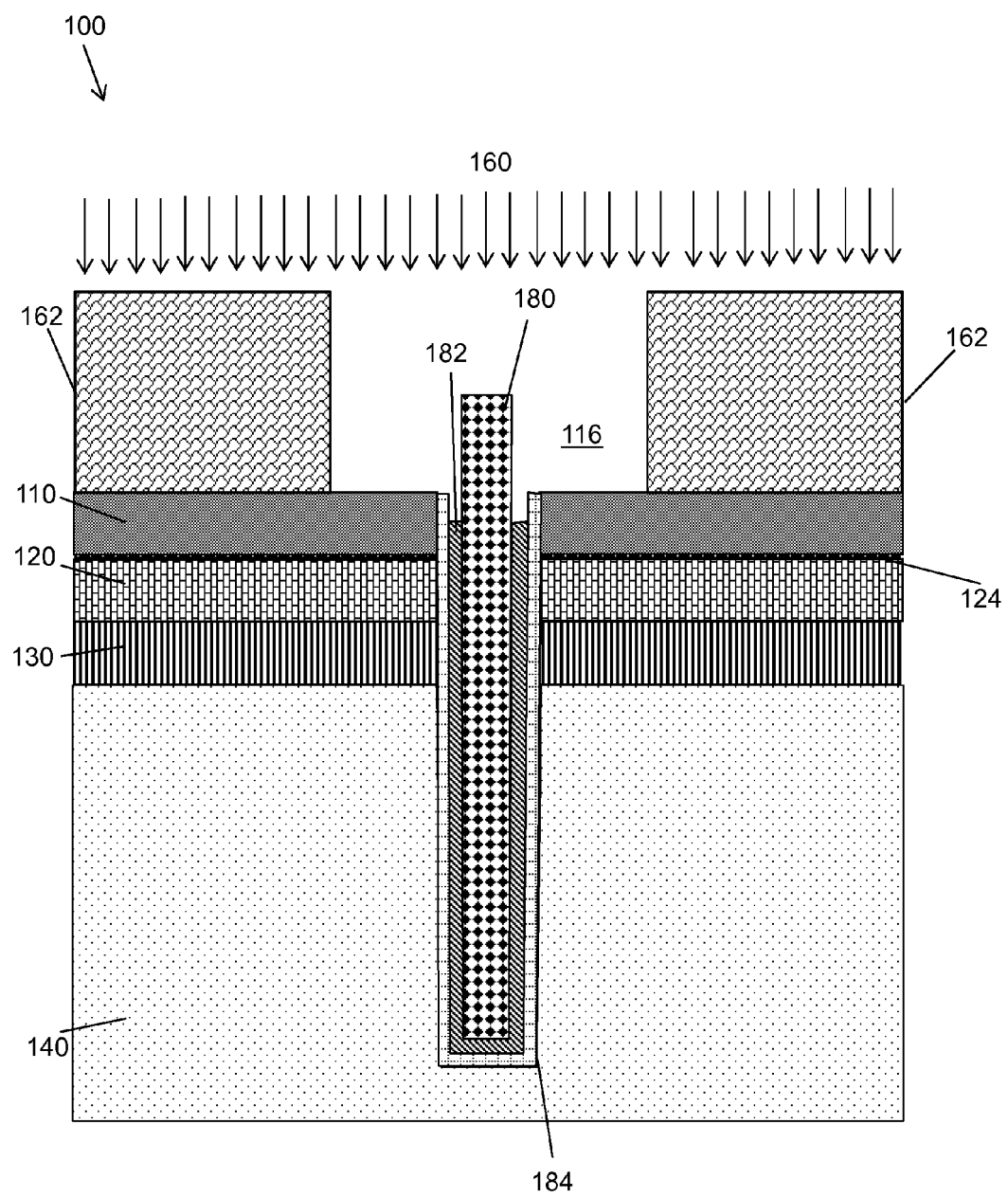

Next, in FIG. 3, a demonstrative illustration of semiconductor device 100 is shown being subjected to a mask deposition 160 according to an embodiment. Mask deposition 160 may form a mask region 162 on a surface of semiconductor device 100. In one embodiment, mask deposition 160 may be selectively deposited on nitride region 110 such that a second substrate contact region 116, and node 180 therein is exposed. In one embodiment, mask region 162 may form a mask array. Mask region 162 may cover/shield deep trenches 102 and/or nodes 180 on semiconductor device 100 which are intended to form other deep trench features (e.g., trench capacitors).

Figure 4:
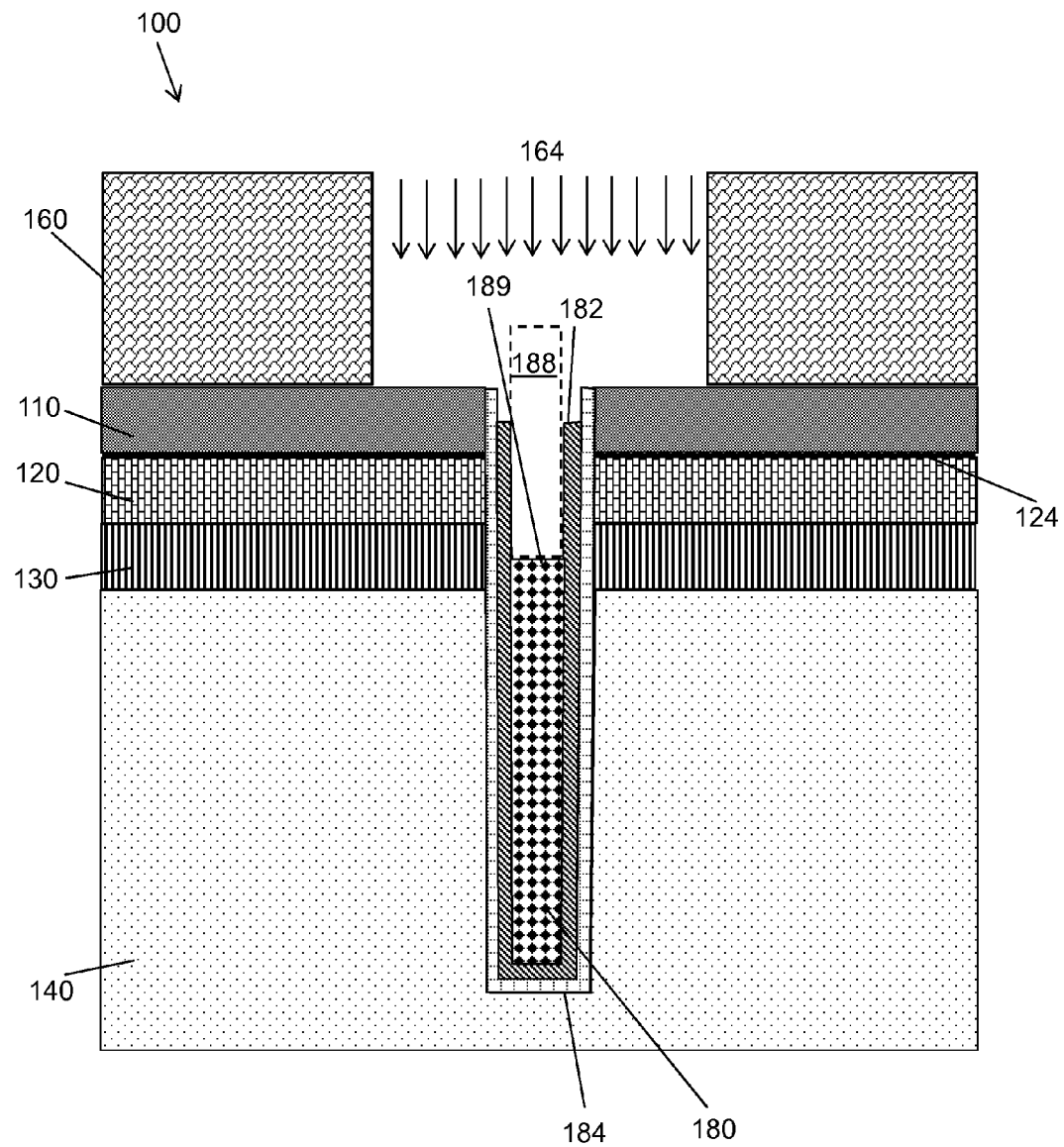

Next, in FIG. 4, a demonstrative illustration of semiconductor device 100 is shown being subjected to a first substrate contact etch 164. This etching process may etch, recess, and/or reduce exposed nodes 180. In one embodiment, mask region 162 may substantially protect nitride layer 110 and some nodes 180 from exposure to first substrate contact etch 164. First substrate contact etch 164 removes a top portion 188 (shown in phantom) of node 180, forming a top surface 189 of node 180 within first node layer 182 and second node layer 184. Top surface 189 may be located substantially below nitride layer 110, SOI region 120 and/or BOX region 130. In one embodiment, etching of node 180 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include O2 (oxygen), a dilutant, and one or more of: C4F6, C5F8, or C4F8. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

Figure 5:
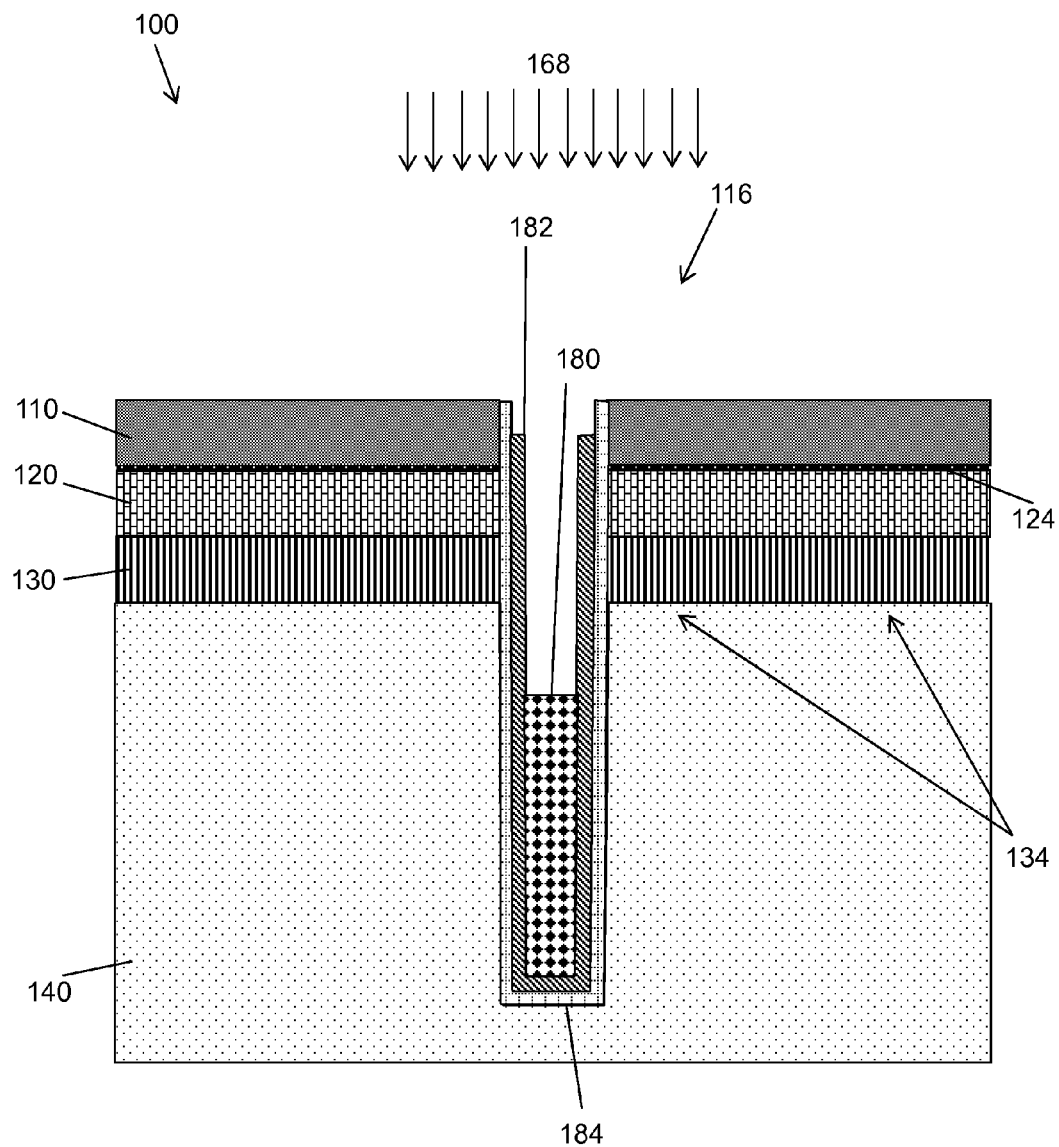

Following first substrate contact etch 164, as shown in the demonstrative illustration of FIG. 5, node films (e.g., mask region) 162 may be removed from semiconductor device 100 and a second substrate contact etch 168 may be performed. Second substrate contact etch 168 may further remove node films and/or portions of substrate contacts on semiconductor device 100 and recess node 180 below BOX region 130. In one embodiment, second substrate contact etch 168 may locate node 180 substantially below an interface 134 between BOX region 130 and substrate 140. Second substrate contact etch 168 may selectively etch only node regions within semiconductor device 100.

Figure 6:
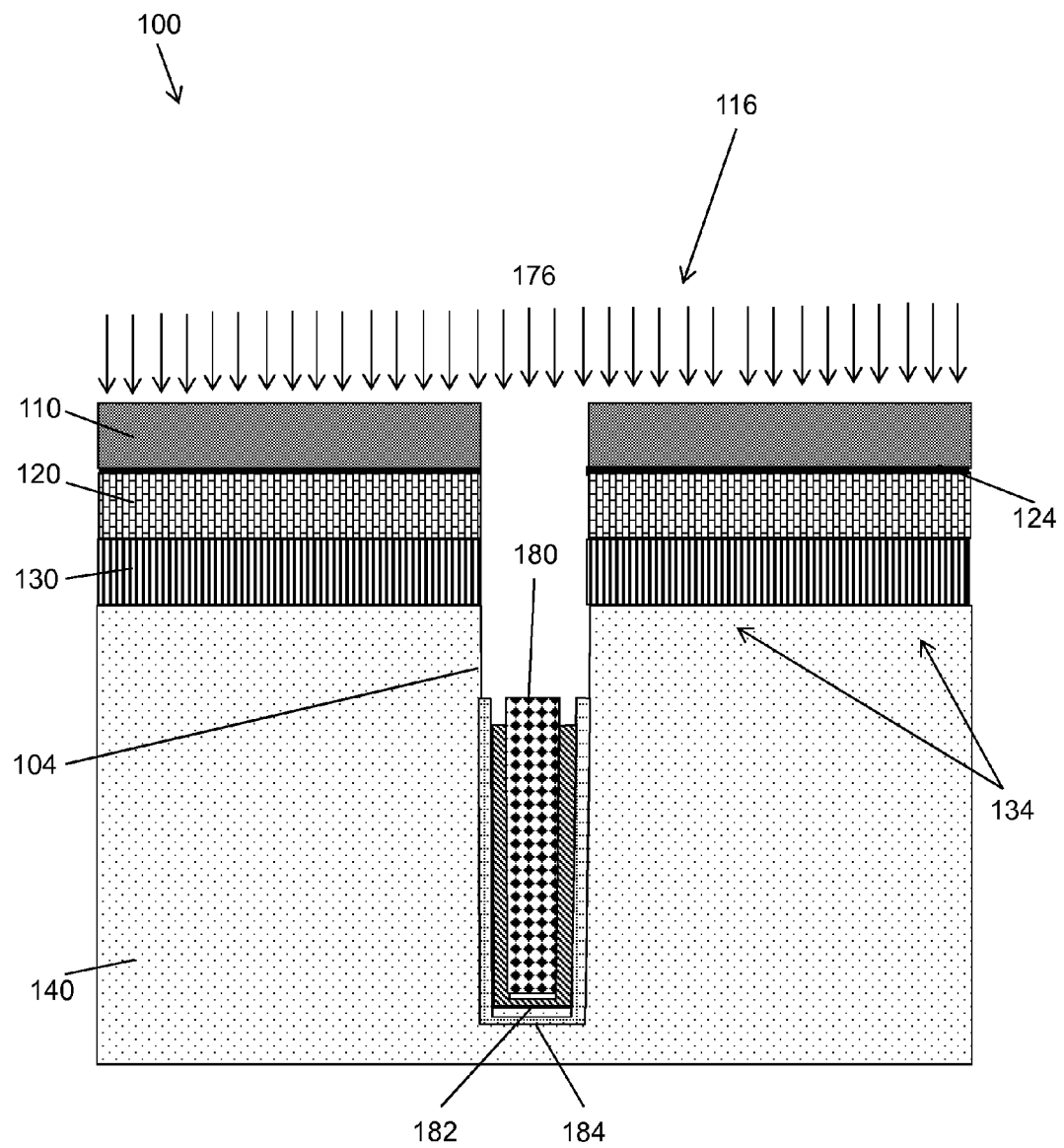

Turning to FIG. 6, a demonstrative illustration of semiconductor device 100 undergoing an etch 176 is shown according to an embodiment of the invention. Etch 176 may remove portions of first node layer 182 and second node layer 184 within semiconductor device 100. In an embodiment, etch 176 may recess first node layer 182 and second node layer 184 within trench 102 to a level substantially even with a top surface of node 180. In one embodiment, etch 176 may locate first node layer 182 and second node layer 184 substantially below interface 134 between BOX region 130 and substrate 140. Etch 176 may expose a surface 104 of substrate 144 within trench 102. In one embodiment, etch 176 may include a single wet etch. In another embodiment, etch 176 may include a reactive ion etch (RIE) followed by a wet etch.

Figure 7:
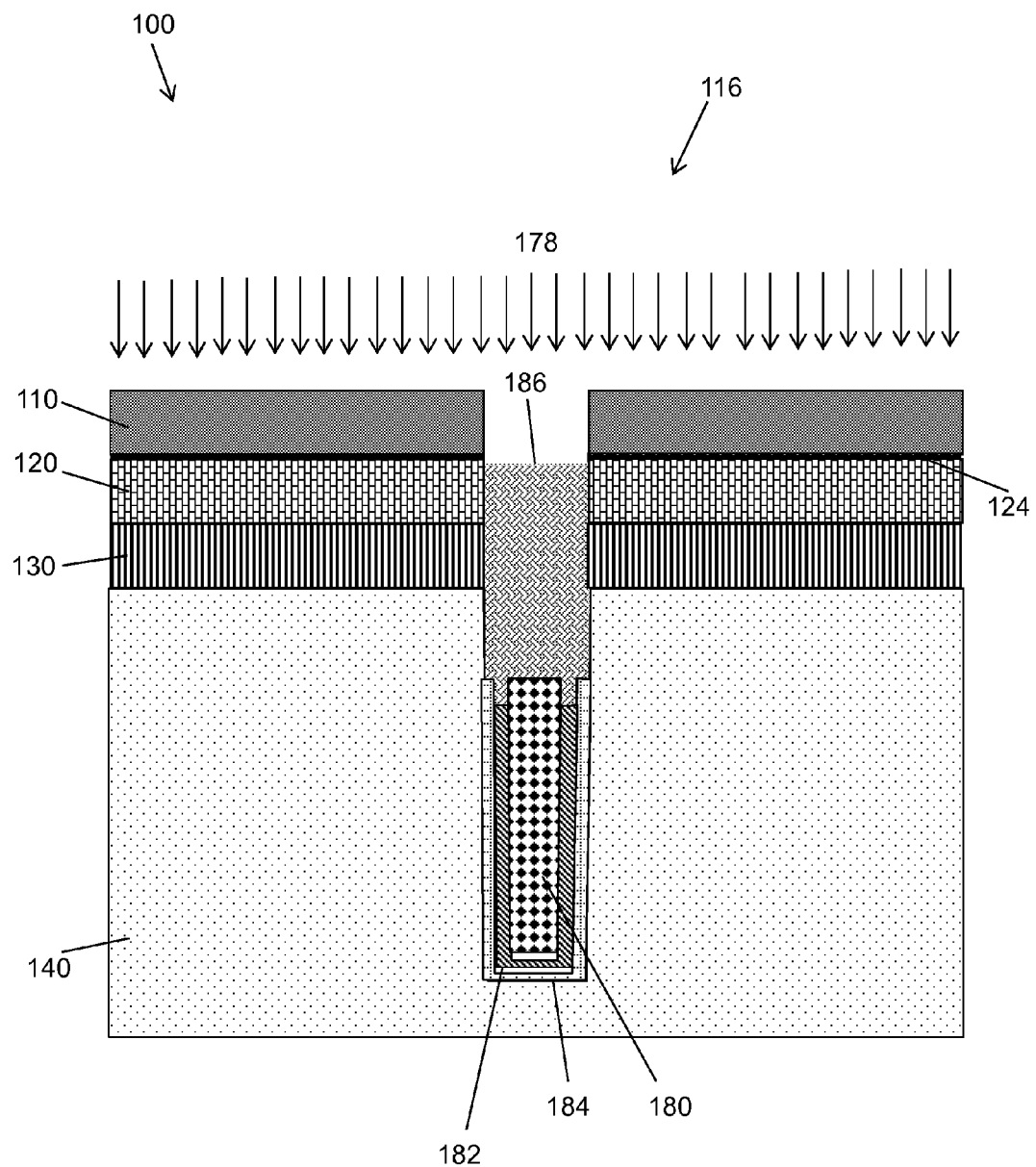

Following etch 176, as shown in the demonstrative illustration of FIG. 7, a contact region 186 may be deposited on semiconductor device 100 to form second substrate contact 116. A deposition 178 may form contact region 186 above node 180 within second substrate contact region 116. Contact region 186 may include doped silicon and may be formed substantially planar relative substrate 140. In embodiments, contact region 186 may be formed along with capacitor structures in adjoining nodes on semiconductor device 100. Thereby, simplifying the fabrication process and reducing steps.

Figure 8:
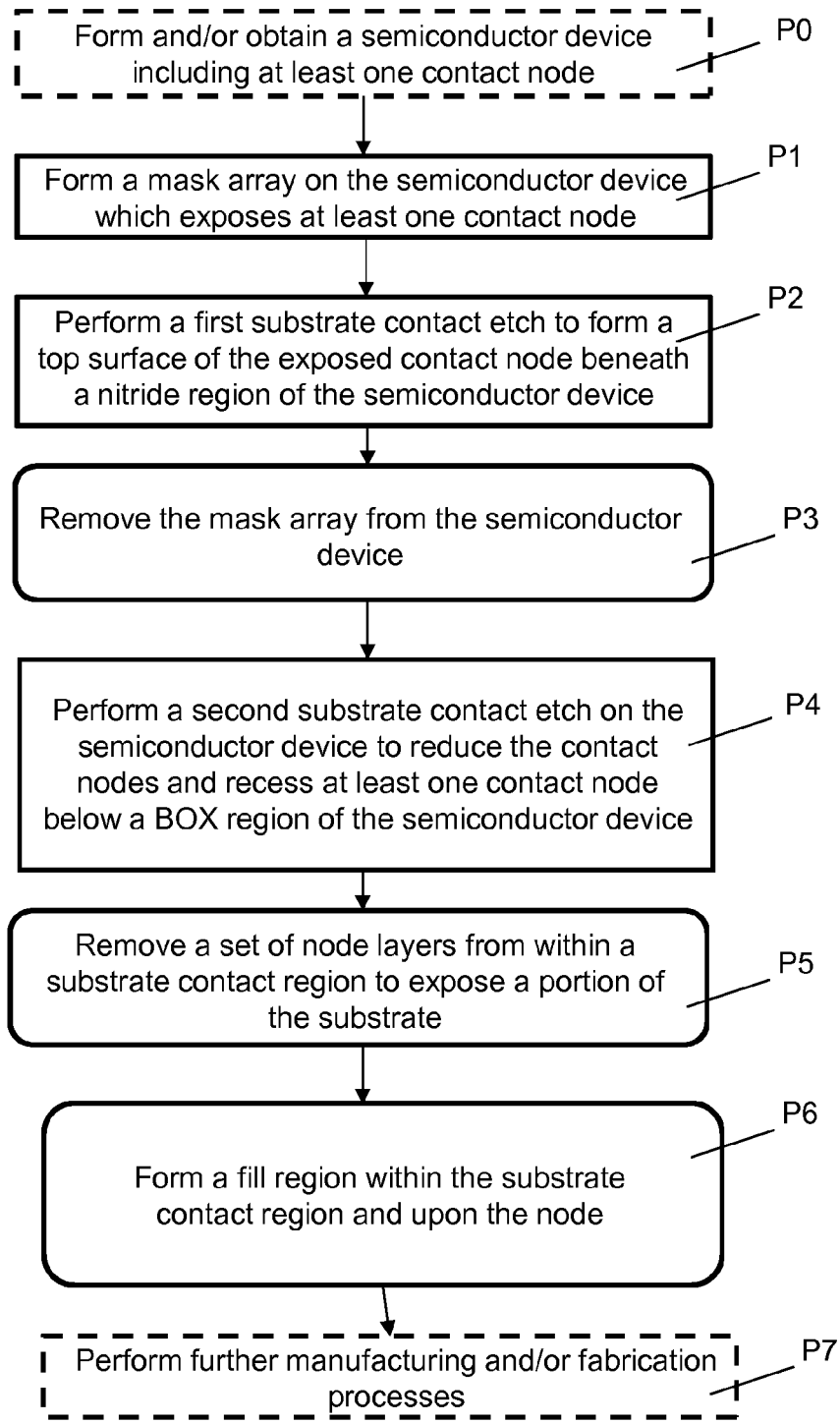
FIG. 8 shows a demonstrative illustration of a method flow diagram illustrating steps in a method of forming an integrated circuit (IC) in accordance with an embodiment.

FIG. 8 is a demonstrative illustration of a flow diagram illustrating methods according to various embodiments of the invention. As shown, the methods can include optional (or additional) processes (shown in phantom), which can be performed according to some embodiments. Turning to optional process P0, the method can include forming and/or obtaining a semiconductor device which may include a set of nodes (e.g., trench capacitors) formed in deep trenches in a substrate, a BOX layer, a SOI layer, and/or a nitride layer. Following optional process P0, process P1 may include forming a mask array on a surface (e.g., top) of semiconductor device 100. The mask layer may cover/shield portions of the semiconductor device including nodes within the set of nodes. In one embodiment, the mask array may be formed about (e.g., exposing, leaving exposed, etc.) at least one node in the set of nodes. Following process P1, process P2 may include performing a first substrate contact etch on the semiconductor device. In one embodiment, the first substrate contact etch may selectively etch the exposed node (e.g., trench capacitor) in the semiconductor device. The exposed node may be etched/reduced to form a top surface of the exposed contact node which is within a trench of the semiconductor device. In one embodiment, the top surface may be located at a level below/beneath a nitride region in the semiconductor device. Following process P2, process P3 may remove the mask array from the semiconductor device to expose the set of contact nodes on semiconductor device. Following process P3, process P4 may include performing a second substrate contact etch on the semiconductor device to reduce the contact nodes and/or recess the contact nodes within the trenches. In one embodiment, the at least one contact node which was subjected to the first substrate contact etch may be etched by the second substrate contact etch to recess below a BOX region of the semiconductor device. The exposed contact node being disposed substantially within the substrate and not protruding into the BOX layer.

Following process P4, in process P5, a set of node layers which line the trench may be removed from semiconductor device 100. In one embodiment, the node layers are removed to a level substantially even with a top of the contact nodes disposed in the substrate. In another embodiment, the node layers may be removed to a level below the top of the contact node. Removal of the node layers may directly expose a surface/portion of the substrate within the trench. Once the node layers are removed in process P5, in process P6, a contact region may be formed within the trench/contact region. The contact region may include doped polysilicon and may directly contact the substrate. In an embodiment, the contact region may be formed directly on the contact nodes. In one embodiment, the contact region may be formed substantially planar relative to the substrate. Following process P6, in process P7, the semiconductor device may be subjected to further processing/fabrication processes as are required. In an embodiment, any of process P1, P2, P3, P5 and/or P6 may be done in conjunction with forming the DTs for eDRAM or decoupling caps.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the regions thereon) to be etched or otherwise processed.

Any number of dielectric regions may be located over the IC/chip body, as many other regions included in semiconductor chips as are now known or later developed. In one embodiment, BOX region 130 may include silicon dioxide ($SiO_2$) for its insulating, mechanical and optical qualities. BOX region 130 may include any commonly used gate dielectric material including but not limited to oxide, nitride, oxynitride, and high-k materials such as hafnium silicate, zirconium silicate, hafnium dioxide, zirconium dioxide, silicon nitride ($Si_3N_4$), fluorinated $SiO_2$ (FSG), hydrogenated silicon oxycarbide (Si-COH), porous SiCOH, boro-phoso-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or regions thereof. In one embodiment, BOX region 130 may include silicon dioxide ($SiO_2$), silicon nitride (SiN), or any other suitable material. BOX region 130 may be deposited using conventional techniques described herein and/or those known in the art. It is understood that while specific material examples for BOX region 130 are described herein, BOX region 130 may include any now known or later developed materials which provide the features described herein.

Substrate 140 can comprise any commonly used substrate material including but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 140 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 140, as illustrated and described, are well known in the art and thus, no further description is necessary.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a contact on a semiconductor device, the method comprising:
    forming a mask on the semiconductor device, the mask exposing at least one contact region including a polysilicon node disposed in a trench of a substrate of the semiconductor device;
    performing a first substrate contact etch on the semiconductor device, the first substrate contact etch recessing the polysilicon node within the trench;
    removing a set of node films disposed about the polysilicon node and on the sides of the trench, wherein the set of node films include at least two films that extend below the polysilicon node, the polysilicon node being disposed entirely within the substrate and the set of node films; and
    forming a contact region within the trench to the substrate and completely covering a top surface of the polysilicon node.

2. The method of claim 1, wherein the contact region includes doped polysilicon.

3. The method of claim 1, wherein the contact region is formed substantially planar relative to the substrate.

4. The method of claim 1, further comprising:
    removing the mask following the first substrate contact etch; and
    performing a second substrate contact etch on the semiconductor device, the second substrate contact etch recessing the polysilicon node within the semiconductor device.

5. The method of claim 1, wherein the first substrate contact etch forms a top surface on the polysilicon node, the top surface located within the substrate beneath an interface between the substrate and a buried oxide (BOX) region.

6. The method of claim 1, wherein the contact region directly connects to an N+ plate in the semiconductor device.

7. A method of forming a contact on a semiconductor device, the method comprising:
    forming a mask on the semiconductor device, the semiconductor device including a set of polysilicon contact nodes and the mask exposing at least one polysilicon contact node disposed within a trench in a substrate of the semiconductor device;
    performing a first substrate contact etch on the semiconductor device, the first substrate contact etch recessing the at least one exposed polysilicon contact node within the trench;
    removing the mask from the semiconductor device;
    performing a second substrate contact etch on the semiconductor device, the second substrate contact etch recessing the set of polysilicon contact nodes within the semiconductor device;
    removing a set of node films disposed above the set of polysilicon contact nodes and on the sides of the trench, wherein the set of node films include at least two films that extend below the polysilicon contact node, the polysilicon contact node being disposed entirely within the substrate and the set of node films; and
    forming a contact region within the trench above the set of polysilicon contact nodes and completely covering a top surface of the set of polysilicon contact nodes.

8. The method of claim 7, wherein the contact region in the at least one exposed polysilicon contact node connects to the substrate.

9. The method of claim 7, wherein the contact region includes doped polysilicon.

10. The method of claim 7, wherein the contact region is formed substantially planar relative to the substrate.

11. The method of claim 7, wherein the first substrate contact etch forms a top surface on the polysilicon contact node, the top surface located within the substrate beneath an interface between the substrate and a buried oxide (BOX) region.

12. The method of claim 7, wherein the contact region directly connects to an N+ plate in the semiconductor device.

13. A method of forming a contact on a semiconductor device, the method comprising:
    masking regions of the semiconductor device other than a set of substrate contacts, the set of substrate contacts including a set of polysilicon contact nodes disposed within a trench in a substrate of the semiconductor device;
    etching about the set of substrate contacts on the semiconductor device;
    removing a portion of the set of polysilicon contact nodes from the trench; and
    removing a set of node films disposed above the set of polysilicon contact nodes and on the sides of the trench following the etching, wherein the set of node films include at least two films that extend below at least one of the set of polysilicon contact nodes, the at least one polysilicon contact node being disposed entirely within the substrate and the set of node films; and
    forming a contact region within the trench above the set of contact nodes and completely covering a top surface of the set of polysilicon contact nodes, the contact region substantially connected to the set of contact nodes and the substrate.

14. The method of claim 13, further comprising removing the masked regions of the semiconductor device following the etching.

15. The method of claim 13, wherein the contact region includes doped polysilicon.

16. The method of claim 13, wherein the contact region is formed substantially planar relative to the substrate.

17. The method of claim 13, wherein the etch forms a top surface on the set of polysilicon contact nodes, the top surface located within the substrate beneath an interface between the substrate and a buried oxide (BOX) region.

18. The method of claim 13, wherein the contact region directly connects to an N+ plate in the semiconductor device.

* * * * *